US011936284B2

(12) United States Patent
Qaiyum et al.

(10) Patent No.: US 11,936,284 B2
(45) Date of Patent: Mar. 19, 2024

(54) CONSTANT RIPPLE ALGORITHM IN DCM FOR BUCK CONVERTER

(71) Applicant: TEXAS INSTRUMENTS INCORPORATED, Dallas, TX (US)

(72) Inventors: Asif Qaiyum, Freising (DE); Ruediger Kuhn, Freising (DE); Martin Schneider, Kraiburg am Inn (DE)

(73) Assignee: Texas Instruments Incorporated, Dallas, TX (US)

( * ) Notice: Subject to any disclaimer, the term of this patent is extended or adjusted under 35 U.S.C. 154(b) by 52 days.

(21) Appl. No.: 17/489,494

(22) Filed: Sep. 29, 2021

(65) Prior Publication Data

US 2023/0101068 A1 Mar. 30, 2023

(51) Int. Cl.
*H02M 3/158* (2006.01)
*H02M 1/00* (2006.01)
*H02M 1/14* (2006.01)
*G01R 19/165* (2006.01)
*G01R 19/175* (2006.01)

(52) U.S. Cl.
CPC ........... *H02M 1/14* (2013.01); *H02M 1/0012* (2021.05); *H02M 1/0025* (2021.05); *H02M 3/158* (2013.01); *G01R 19/16528* (2013.01); *G01R 19/175* (2013.01)

(58) Field of Classification Search
CPC ........ H02M 3/158; H02M 1/14; H02M 3/157; H02M 1/0032; H02M 1/0012
See application file for complete search history.

(56) References Cited

U.S. PATENT DOCUMENTS

| | | | |
|---|---|---|---|
| 10,715,039 B1* | 7/2020 | Ilango | G01R 19/175 |
| 2015/0311787 A1* | 10/2015 | Maede | H02M 3/156 323/271 |
| 2015/0381045 A1* | 12/2015 | Chen | H02M 3/156 323/271 |
| 2016/0204702 A1* | 7/2016 | Padyana | H02M 3/1563 323/271 |
| 2019/0252969 A1* | 8/2019 | Li | H02M 3/158 |

* cited by examiner

*Primary Examiner* — Alex Torres-Rivera
(74) *Attorney, Agent, or Firm* — Brian D. Graham; Frank D. Cimino

(57) ABSTRACT

A ripple voltage detector circuit comprises a pulse generator, a direct current-to-direct current (DC-DC) converter coupled to the pulse generator, and a first control loop coupled to the pulse generator and the DC-DC converter. The first control loop is configured to measure an output voltage of the DC-DC converter, determine an output ripple voltage of the output voltage, determine a ripple coefficient based on the output ripple voltage, determine a reference peak inductor current based on the ripple coefficient, and determine a peak value of an inductor current during a switching cycle, and transition a switching state of the DC-DC converter based on the reference peak inductor current and the peak value of the inductor current.

20 Claims, 4 Drawing Sheets

CONSTANT RIPPLE ALGORITHM IN DCM FOR BUCK CONVERTER

BACKGROUND

A switched-mode power supply (e.g., "switched converter") alternately stores energy in energy storage devices (such as inductors and capacitors) and outputs the stored energy to a load such as an electronic device during a switching cycle of the inductor. During the switching cycle, power switches in the switched converter are actuated (e.g., alternated between a "turned ON" state and a "turned OFF" state) to control the amount of energy that is provided from a voltage source or output to a load. Switching converters can operate in either a discontinuous conduction mode (DCM) or a continuous conduction mode (CCM). In the DCM (also called a pulse frequency modulation (PFM) mode), the switched converter completely de-energizes the energy storage device before the end of every DCM switching cycle. Accordingly, for an inductive energy storage device, no current flows into the energy storage device at the start of every DCM switching cycle. Thus, the DCM switching cycle time period is equal to the on-time time period ToN when the power switch is "ON" to energize the inductor, plus the off-time time period $T_{OFF}$ in which the switch is "OFF" to de-energize the inductor, plus any idle-time time period $T_{IDLE}$ in which the inductor current is zero. DCM improves light load efficiency in switched converters, and is generally used in applications for electrical loads that are in the low-to-medium load current range.

SUMMARY

In accordance with at least one example of the disclosure, a system operating in a discontinuous conduction mode (DCM) comprises a ripple voltage detector circuit and a voltage converter circuit coupled to the ripple voltage detector circuit. The ripple voltage detector circuit comprises a pulse generator, a first control loop coupled to the pulse generator, and a second control loop coupled to the pulse generator. The voltage converter circuit comprises an inductor comprising a first inductor end and a second inductor end, a first switch coupled between a voltage source and the first inductor end and comprising a first gate terminal coupled to the ripple voltage detector circuit, a second switch coupled between the first inductor end and ground and comprising a second gate terminal coupled to the ripple voltage detector circuit, and a capacitor comprising a first capacitor end and a second capacitor end, whereby the first capacitor end is coupled to the second inductor end.

In accordance with another example of the disclosure, a ripple voltage detector circuit comprises a pulse generator, a direct current-to-direct current (DC-DC) converter coupled to the pulse generator, and a first control loop coupled to the pulse generator and the DC-DC converter. The first control loop is configured to measure an output voltage of the DC-DC converter, determine an output ripple voltage of the output voltage, determine a ripple coefficient based on the output ripple voltage, determine a reference peak inductor current based on the ripple coefficient, determine a peak value of an inductor current during a switching cycle, and transition a switching state of the DC-DC converter based on the reference peak inductor current and the peak value of the inductor current.

In accordance with another example of the disclosure, a system comprises a voltage converter circuit and a ripple voltage detector circuit coupled to the voltage converter circuit. The voltage converter circuit comprises a first switch configured to be coupled to a pulse generator, a second switch configured to be coupled to a pulse generator, an inductor comprising a first inductor end and a second inductor end, and a capacitor comprising a first capacitor end and a second capacitor end. The first switch is configured to receive signals from the pulse generator that causes the first switch to selectively turn ON and turn OFF during a switching cycle. The second switch is configured to receive signals from the pulse generator that that causes the second switch to selectively turn ON and turn OFF during the DCM switching cycle. The first inductor end is coupled to the first switch and to the second switch. The first capacitor end is coupled to the second inductor end. The ripple voltage detector circuit comprises the pulse generator and a first control loop coupled to the pulse generator and the voltage converter circuit. The first control loop is configured to measure an output voltage of the voltage converter circuit, determine an output ripple voltage of the output voltage, determine a ripple coefficient based on the output ripple voltage, determine a reference peak inductor current based on the ripple coefficient, determine a peak value of an inductor current during the switching cycle, and transition a switching state of the voltage converter circuit based on the reference peak inductor current and the peak value of the inductor current.

BRIEF DESCRIPTION OF THE DRAWINGS

For a detailed description of various examples, reference will now be made to the accompanying drawings in which.

DETAILED DESCRIPTION

Figure 1:
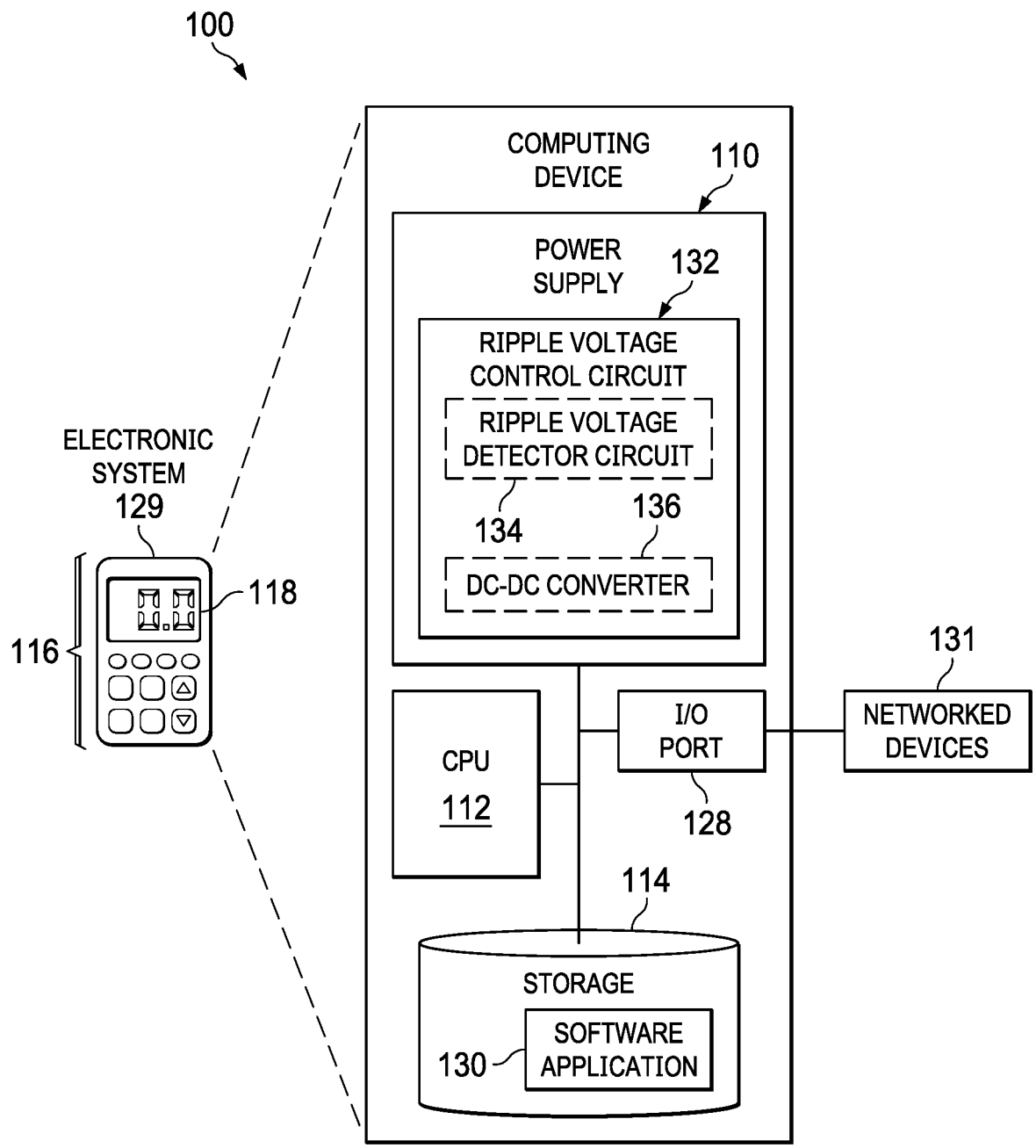
FIG. 1 is a block diagram of a computing device in accordance with various examples.

When a direct current-to-direct current (DC-DC) switched converter (e.g., a buck converter) is operated in a DCM, the output voltage Vout from the DC-DC switched converter fluctuates (e.g., is perturbed) during each DCM switching cycle. The perturbation in the output voltage Vout is the ripple voltage of the DC-DC switched converter. Some electronic devices have a tightly controlled and/or configurable ripple voltage when using DC-DC switched converters that operate in the DCM.

Ripple voltage in switched converter architectures can vary with input voltage (e.g., battery voltage), vary with external inductor and capacitor components that are used for energy storage, and vary with low and medium load currents supplied to an electronic device. Many DC-DC switched converter architectures, when operating in a DCM, have a ripple voltage that cannot be controlled independently of other operating parameters such as, for example, an input voltage, load currents, and variations in inductance in an external inductor and capacitance in an external capacitor at the load. Also, many DC-DC switched converter architectures produce varying output ripple voltage when these operating conditions such as, for example, the battery voltage, load currents, and external inductance and capacitance vary.

Disclosed herein are examples of a ripple voltage control circuit for regulating the ripple voltage in an output voltage Vout of a DC-DC converter that is operating in a DCM for varying operating conditions. The ripple voltage control circuit includes a peak current detector circuit coupled to a DC-DC converter (e.g., buck converter). The DC-DC converter includes a high-side (HS) power metal oxide semiconductor field effect transistor (MOSFET) switch, a low-side (LS) MOSFET switch, an energy storage element such as an inductor, and a filter/decoupling capacitor. In an example, the HS power MOSFET switch is a p-channel MOSFET (PMOS) switch and the LS MOSFET switch is a N-channel MOSFET (NMOS) switch. In examples, the HS power MOSFET and the LS power MOSFET are PMOS switches, or the HS power MOSFET and the LS power MOSFET are NMOS switches.

The DC-DC converter circuit includes a plurality of mixed-signal control loops. In an example when the HS MOSFET is a PMOS switch and the LS MOSFET is a NMOS switch, a DCM initiation control loop determines when to initiate a new DCM switching cycle based on the current output voltage and whether the PMOS switch and the NMOS switch are switched ON or switched OFF. The DCM initiation control loop includes an analog-to-digital converter (ADC), a first adder, a comparator, an AND gate (e.g., a logical AND gate), a pulse generator, a high-side switch and a low-side switch. The ADC converts the measured amplitude of the output voltage Vout to a digital code and provides the Vout digital code to the first adder. In an example, the first adder subtracts the Vout digital code from a voltage target code to obtain an error value representing the difference. When the Vout digital code is greater than the voltage target code, the error value is negative. A comparator compares the error value to a threshold, such as 0. The output signal from the comparator is a logical 1 when the error value is lesser than 0, and is otherwise a logical 0. In an example, the output signal from the comparator is sent to the pulse generator to trigger the pulse generator to begin a DCM switching cycle by providing control signals to the high-side switch and the low-side switch.

A DCM measurement control loop determines the ripple voltage. The ripple voltage measurement control loop includes an ADC (e.g., the same ADC described above), a ripple detector, a second adder, a ripple coefficient comparator, an accumulator, a digital-to-analog converter (DAC) to provide a reference peak current, and a peak current detector. At each DCM initiation control loop's triggering of the pulse generator to begin the new DCM cycle, the DCM measurement control loop determines the current output ripple and adjusts the inductor peak current value such that the output ripple converges to the desired output ripple target.

In an example, the ripple voltage control circuit disclosed herein controls the ripple voltage of an output voltage Vout of a DC-DC switched converter operating in a DCM that is independent of the direct current (DC) input voltage (e.g., battery voltage), inductor and capacitor components used, and the low and medium load currents drawn by an electronic device.

FIG. 1 is a block diagram of a computing device 100 in accordance with various examples. For example, the computing device 100 is, or is incorporated into, or is coupled (e.g., connected) to an electronic system 129, such as a computer, electronics control "box" or display, communications equipment (including transmitters or receivers), or any type of electronic system operable to process information.

In some examples, computing device 100 comprises a megacell or a system-on-chip (SoC) that includes control logic such as a power supply 110, central processing unit (CPU) 112, storage 114 (e.g., a random-access memory (RAM)), user interface (UI) 116, display 118, and input-output (I/O) port 128. In examples, CPU 112 is a CISC-type (Complex Instruction Set Computer) CPU, RISC-type CPU (Reduced Instruction Set Computer), MCU-type (Microcontroller Unit), or a digital signal processor (DSP). CPU 112 comprises one or more processors. The one or more processors are arranged to execute code for transforming the one or more processors into a special-purpose machine or for improving the functions of other components in computing device 100 to provide a desired output without performing similar operations as the one or more processors. CPU 112 comprises memory and logic that store information frequently accessed from storage 114.

In some examples, storage 114 is memory such as an on-processor cache, off-processor cache, RAM, flash memory, or disk storage for storing one or more software applications 130 (e.g., embedded applications). The one or more software applications 130 (e.g., embedded applications), when executed by CPU 112, perform functions associated with computing device 100 that are described herein.

In an example, a user controls computing device 100 using UI 116. In an example, during execution of software application 130, a user provides inputs to computing device 100 via UI 116, and receives outputs from computing device 100. In examples, the outputs are provided via display 118, indicator lights, a speaker, vibrations, and the like. The input is received using audio and/or video inputs (using, for example, voice or image recognition), and electrical and/or mechanical devices such as keypads, switches, proximity detectors, gyros, accelerometers, and the like.

CPU 112 and power supply 110 are coupled to I/O port 128. In an example, I/O port 128 provides an interface that is configured to receive input from (and/or provide output to) networked devices 131. Networked devices 131 can include any device (including test equipment) capable of point-to-point and/or networked communications with computing device 100. In examples, computing device 100 is coupled to peripherals and/or other computing devices, including tangible, non-transitory media (such as flash memory), and/or cabled or wireless media. These and other input and output devices are selectively coupled to the computing device 100 by external devices using wireless or cabled connections. Storage 114 is accessible, for example, by networked devices 131. CPU 112, storage 114, and power supply 110 are also optionally coupled to an external power supply (not shown), which is configured to receive power from a power source (such as a battery, solar cell, "live" power cord, inductive field, fuel cell, capacitor, and the like).

In an example, power supply 110 is a DC-DC switched-mode power supply (e.g., "switched converter") that is operable to operate in a DCM. In examples, power supply 110 is in the same physical assembly as computing device 100, or is coupled to computing device 100. Power supply 110 includes ripple voltage control circuit 132. Ripple voltage control circuit 132 includes a ripple voltage detector circuit 134 that is coupled to a hysteretic (e.g., sensorless) DC-DC converter 136 (also called a voltage converter circuit). Although ripple voltage detector circuit 134 and DC-DC converter 136 are illustrated as being included in power supply 110 as a single unit, in examples, various portions of ripple voltage detector circuit 134 and DC-DC converter 136 are included in the same module (e.g., as formed by a die as produced in semiconductor manufacturing) or in different modules. While not shown in FIG. 1, power supply 110 includes power generating components. Power generating components include one or more power switches. Each of the power switches is independently controlled for generating power to supply power at various input voltages to various components of computing device 100. Computing device 100 operates in various power-saving modes wherein individual voltages are supplied (and/or turned off) by the power switches in accordance with a selected power-saving mode and the various components arranged within a specific power domain.

In an example, ripple voltage control circuit 132 is configured to operate the DC-DC converter 136 in a DCM and to regulate a ripple voltage of an output voltage Vout of the DC-DC converter 136 using one or more mixed-signal control loops. Ripple voltage control circuit 132 is operable to determine a ripple voltage in a DCM switching cycle and selectively control the ripple voltage of an output voltage Vout in subsequent DCM switching cycles. The ripple voltage control circuit 132 provides and controls the voltage PFM pulses that are applied to the DC-DC converter 136 in order to control the sourcing of inductor current ($I_L$) during a charge cycle and a discharge cycle of energy storage components in the power supply 110. Controlling the DCM switching cycle controls the output voltage Vout that is generated and the ripple voltage of output voltage Vout. In various examples, the teachings disclosed herein can be applied to virtually all DCM controllers with mixed-signal control loops in asynchronous buck converters, all DCM controllers with analog control loops in asynchronous buck converters, and all DCM controllers with digital or analog control loops in boost converters.

Figure 2:
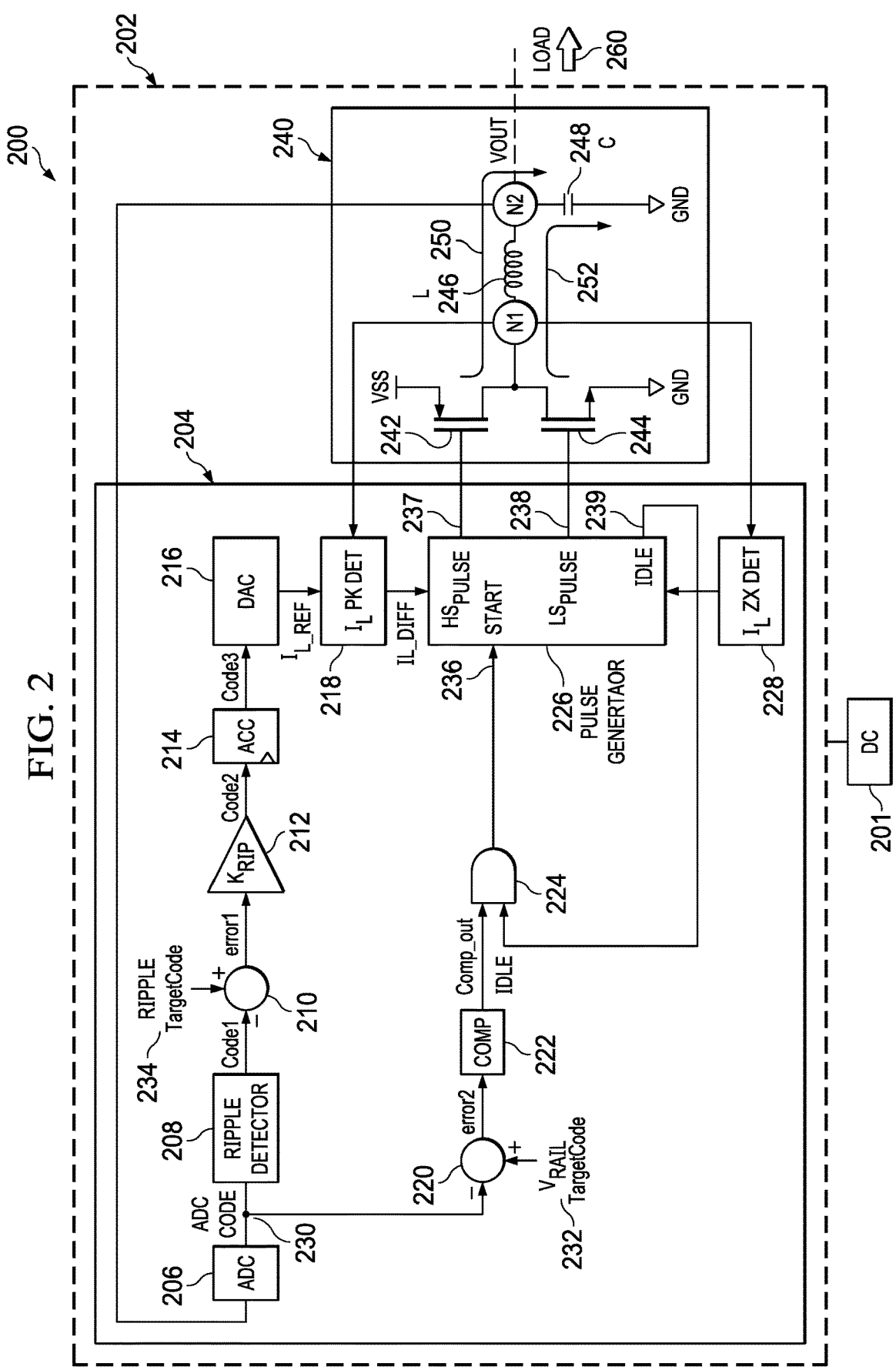
FIG. 2 is a schematic block diagram of a ripple voltage control circuit in accordance with various examples.

FIG. 2 is a schematic block diagram of ripple voltage control circuit 200 in accordance with various examples. Ripple voltage control circuit 200 is an example of ripple voltage control circuit 132 of FIG. 1, and, in examples, is formed (e.g., in whole or in part) on a substrate 202. Generally described, ripple voltage control circuit 200 is a power converter comprising a ripple voltage detector circuit 204 coupled (e.g., electrically) to a DC-DC converter 240. Ripple voltage control circuit 200 includes two mixed-signal control loop feedback paths comprising electrical components to determine when to initiate a new DCM switching cycle using a DCM initiation control loop, and to determine a ripple voltage of an output voltage Vout using a DCM measurement control loop, as discussed below. A DC input voltage source 201 is coupled to the ripple voltage control circuit 200 and may provide one or more power rails such as Vss. The particular design of the ripple voltage detector circuit 204 and the DC-DC converter 240 may vary.

Ripple voltage detector circuit 204 includes an example of ripple voltage detector circuit 134 of FIG. 1. Generally shown, ripple voltage detector circuit 204 includes an ADC 206, ripple detector 208, adder 210, ripple coefficient comparator 212, accumulator/integrator 214, digital-to-analog converter (DAC) 216, peak current detector 218, adder 220, comparator 222, AND gate 224, pulse generator 226, and zero-crossing current detector 228. A DCM initiation control loop is configured to determine when to initiate a DCM cycle and comprises ADC 206, adder 220, comparator 222, AND gate 224, pulse generator 226, PMOS switch 242, and NMOS switch 244. A DCM measurement control loop is configured to determine the ripple voltage and adjust the switching frequency based on the ripple voltage and comprises ADC 206, ripple detector 208, adder 210, ripple coefficient comparator 212, accumulator 214, and DAC 216.

An input of ADC 206 is coupled to the DC-DC converter 240 at node N2, and an output of ADC 206 is coupled to node 230. Node 230 is coupled to an input of ripple detector 208 and is coupled to an input of adder 220. Output of the ripple detector 208 is coupled to the adder 210. The ADC 206 receives, at its input, an analog voltage of an amplitude of the output voltage Vout at node N2 and outputs a digital value ADC_code. In an example, the ADC 206 converts the output voltage Vout to the digital value ADC_code, which represents a digital value of the output voltage Vout.

The ripple detector 208 receives a set of digital values (ADC_code) over a set of switching cycles of the DC-DC converter 136 from the ADC 206. As Vout, and by extension, ADC_code can be considered to have a DC component and an AC ripple, the ripple detector 208 isolates the AC ripple variation in Vout using the variation in the set of digital values ADC_code across one or more switching cycles. To do so, the ripple detector may apply rectification, filtering, thresholding, and/or other functions to the set of digital values (ADC_code) received from the ADC 206. In some examples, the ripple detector applies these functions to determine the maximum and minimum values in ADC_code over the one or more switching cycles and provides a digital code, code 1, that correspond to the magnitude of the ripple in Vout based on the difference between the maximum and minimum values. The ripple detector 208 is coupled to the adder 210 and provides the digital code code1 to the adder 210. As used herein, a digital code is a digital value comprising binary digits.

In an example, a first input of adder 210 receives the digital code code1 from the ripple detector 208 and a second input of adder 210 receives a ripple target code 234 as a digital code. In examples, the ripple target code 234 is a programmable digital value or is a user-configurable digital code representing a tolerable amount of ripple in Vout. An input of the ripple coefficient comparator 212 is coupled to the output of adder 210, and an output of the ripple coefficient comparator 212 is coupled to an input of the accumulator 214. An output of the accumulator 214 is coupled to an input of the DAC 216. An input of the peak current detector 218 is coupled to an output of the DAC 216, another input of the peak current detector 218 is coupled to the DC-DC converter 240, and an output of the peak current detector 218 is coupled to the pulse generator 226.

In an example, adder 220 receives a voltage target code 232 and the set of digital values (ADC_code) at its input. The voltage target code 232 is a digital code of a target output voltage Vout_target. In examples, voltage target code 232 is a programmable digital code or is a user-configurable digital code. In an example, target output voltage Vout_target is a reference value for an output voltage (e.g., output voltage Vout) that is to be outputted from the DC-DC converter 240 at node N2. In various examples, Vout_target represents a minimum value of the output voltage, an average value of the output voltage, or any other suitable reference value for the output voltage and may include one or more factors to account for hysteresis in ripple voltage control circuit 200. An output of the adder 220 is coupled to an input of the comparator 222. A first input of an AND gate 224 is coupled to the comparator 222 and a second input of the AND gate 224 is coupled to node 239 of the pulse generator 226. AND gate 224 receives a comparison result from the comparator 222 and a second input as an IDLE digital code from node 239 of the pulse generator 226. An output of the AND gate 224 is coupled to the pulse generator 226. The pulse generator 226 receives a first digital code from an output of the AND gate 224 at node 236, a second digital code from the output of the peak current detector 218, and a third digital code from an output of the zero-crossing current detector 228. The zero-crossing current detector 228 is coupled to node N1 and to the pulse generator 226. The pulse generator is coupled to the gate terminal (or node) of PMOS switch 242 at high-side pulse output 237, and is coupled to the gate terminal (or node) of the NMOS switch 244 at low-side pulse output 238. The pulse generator 226 may include hardwired logic, programmable logic executing instructions from a non-transitory memory, or any combination thereof, and in some examples, is implemented using an asynchronous (e.g., non-clocked) finite-state machine (AFSM).

DC-DC converter 240 includes an example of DC-DC converter 136 of FIG. 1. As generally shown in FIG. 2 in an example, DC-DC converter 240 comprises a high-side (HS) PMOS switch 242, a low-side (LS) NMOS switch 244, an energy storage element such as inductor 246, and a filter/decoupling capacitor 248. While DC-DC converter 240 is illustrated with PMOS switch 242 and NMOS switch 244, in an example, any of the power switches 242, 244 may be PMOS switches or NMOS switches.

The inductor 246 is coupled between a node N1 and a node N2. Node N1 is coupled to the drain terminals (or nodes) of PMOS switch 242 and NMOS switch 244, is electrically coupled to an input of the peak current detector 218, and is electrically coupled to an input of the zero-crossing detector 228. Node N2 is electrically coupled to a first end of capacitor 248 and to an input of the ADC 206. Inductor current $I_L$, during the DCM switching cycle, is measured at node N1 by the peak current detector 218 and the zero-crossing detector 228. An output voltage Vout is generated by the DC-DC converter 240 during the DCM switching cycle and is obtained at node N2. A load 260 is coupled in parallel to node N2. A second end of the capacitor 248 is coupled to a ground voltage potential. The source terminals (or nodes) of PMOS switch 242 is electrically coupled to a voltage source VSS, and the source terminal of NMOS switch 244 is electrically coupled to a ground voltage potential. A gate terminal (or node) of the PMOS switch 242 is coupled to a high-side pulse output 237 of the pulse generator 226, and a gate terminal (or node) of the NMOS switch 244 is coupled to a low-side pulse output 238 of the pulse generator 226.

The pulse generator 226 provides signals at the high-side pulse output 237 and low-side pulse output 238 that cause the DC-DC-converter 240 to alternately charge and discharge the inductor 246 in a DCM and may adjust these signals in order to control the ripple voltage of Vout. In an example, the pulse generator 226 provides and controls the voltage PFM pulses that are applied to the gate terminals of the PMOS switch 242 and NMOS switch 244 in order to control the sourcing of inductor current $I_L$ flowing through the inductor 246 during a DCM switching cycle of the inductor 246. Controlling the DCM switching cycle controls the Vout generated at the node N2. In practice, Vout may have a DC component and an AC ripple component, and the pulse generator 26, in combination with control loop feedback paths of the ripple voltage detector circuit 204 may adjust the voltage PFM pulses to keep the AC ripple component centered around a ripple target.

In operation, during a DCM switching cycle when Vout at node N2 is below a target output voltage Vout_target, the pulse generator 226 may provide a logic-low signal at the high-side pulse output 237 and thereby at the gate terminal of the PMOS switch 242 that turns ON the PMOS switch 242 to energize the inductor 246. The pulse generator 226 may also provide a logic low signal at the low-side pulse output 238, which keeps NMOS switch 244 open. When the PMOS switch 242 is closed, inductor current $I_L$ flows from DC input voltage source 201, through PMOS switch 242, and through inductor 246 to an output voltage Vout at node N2 along current path 250. The inductor current $I_L$ increases in a ramp. Node N2 is coupled to a filter/decoupling capacitor 248, and a capacitor voltage of the capacitor 248 also increases. A load 260 (e.g., when present) is coupled electrically in parallel with the capacitor 248 at node N2. Accordingly, the inductor current $I_L$ increases through the inductor 246, and Vout at node N2 also increases.

The inductor current $I_L$ is measured by the peak current detector 218 coupled to node N1. The peak current detector 218 periodically measures the inductor current $I_L$ using a sensor in the peak current detector 218. The PMOS switch 242 is maintained closed while the inductor current $I_L$ increases but is less than a peak inductor current $I_{L\_peak}$ (e.g., a predetermined maximum inductor current for a measured ripple voltage). The value of peak inductor current $I_{L\_peak}$ can be predetermined (e.g., at design time or during a period of operation of the ripple voltage control circuit 200 before the pulse generator 226 is activated). The peak current detector 218 obtains the peak inductor current $I_{L\_peak}$ when the inductor current $I_L$ reaches the peak inductor current $I_{L\_peak}$. The time period when inductor current $I_L$ ramps up from zero to peak inductor current $I_{L\_peak}$ is the on-time time period TON of the inductor 246. The peak current detector 218 converts the peak inductor current $I_{L\_peak}$ to a digital code. The digital code is a peak detector trigger signal to trigger the pulse generator 226 to turn OFF the PMOS switch 242 and stop the charging cycle. The peak current detector 218 sends the digital code to the pulse generator 226, which turns OFF the PMOS switch 242 and turns ON the NMOS switch 244 in response to receiving the digital code. The PMOS switch 242 and NMOS switch 244 are controlled asynchronously to prevent shoot-through. Shoot-through occurs when the PMOS switch 242 and the NMOS switch 244 are both ON at the same time, providing a short to a ground voltage potential.

When the NMOS switch 244 is closed, the inductor current $I_L$ flows from ground voltage potential, through the NMOS switch 244, and through inductor 246 to the output voltage Vout at node N2 along current path 252 to which a filter/decoupling capacitor 248 is coupled. A load 260 (e.g., when present) is coupled electrically in parallel with the capacitor 248.

In an example, the inductor current $I_L$, during a DCM switching cycle (e.g., a current DCM switching cycle), is measured by the zero-crossing current detector 228 that is coupled to node N1. The zero-crossing current detector 228 periodically measures the inductor current $I_L$ using a sensor to determine when the inductor current $I_L$ reaches zero (e.g., a zero value). The zero-crossing current detector 228 sends a trigger signal to the pulse generator 226 when the zero-crossing current detector 228 measures the zero value of the inductor current $I_L$. The NMOS switch 244 is maintained closed while the inductor current $I_L$ is greater than zero. When the inductor current $I_L$ reaches zero, the zero-crossing current detector 228 obtains the inductor current $I_L$ and converts it to a digital code. The digital code is a zero-crossing detector trigger signal to trigger the pulse generator 226 to turn OFF the NMOS switch 244 to stop the discharging cycle. The zero-crossing current detector 228 sends the digital code to the pulse generator 226 to trigger the pulse generator 226 to turn OFF the NMOS switch 244 (e.g., NMOS switch 244 switched OFF). The pulse generator 226 turns OFF the NMOS switch 244 in response to receiving the digital value from the zero-crossing current detector 228.

The time period when inductor current $I_L$ decreases from the peak inductor current $I_{L\_peak}$ to zero is the off-time time period $T_{OFF}$ of the inductor 246. As the inductor current $I_L$ decreases in a ramp, the voltage at the capacitor 248 (measured at node N2) increases to an output voltage Vout that is higher than the target output voltage Vout_target. At this time, the PMOS switch 242 and the NMOS switch 244 are both OFF and the inductor current $I_L$ is zero for the duration of the DCM switching cycle. The time period when the inductor current $I_L$ is zero until the next DCM switching cycle is the time idle time period $T_{IDLE}$ of the inductor 246. A load 260 (e.g., when present) is coupled electrically in parallel with the capacitor 248. As an external device draws current from the load 260, the amplitude of the output voltage Vout decreases.

In operation for a DCM initiation control loop, the ripple voltage control circuit 200 is configured to determine when to initiate a new DCM switching cycle based on output voltage Vout during a DCM switching cycle and whether the PMOS switch 242 and the NMOS switch 244 are switched ON or switched OFF. In an example, the ADC 206 constantly obtains the output voltage Vout at node N2 using sensors. The ADC 206 converts the measured amplitude of the output voltage Vout to a digital code ADC_code and provides the digital code ADC_code to the adder 220.

The adder 220 receives a voltage target code 232, which is a digital code of a target output voltage Vout_target for a particular DCM switching cycle of the DC-DC converter 240. In an example, the voltage target code 232 represents a target output voltage Vout_target for a ripple voltage of a specific voltage value. The voltage target code 232 may be calculated from ripple voltages obtained by historically operating the ripple voltage control circuit 200 or may be calculated based on information stored in the pulse generator 226. The adder 220 subtracts the Vout digital code ADC_code from the voltage target code 232 and outputs an error value error2 representing the difference. When the Vout digital code ADC_code is greater than the voltage target code 232, the error value error2 is negative, and is otherwise positive when the Vout digital code ADC_code is lesser than the voltage target code 232.

The comparator 222 receives the error value error2 and compares the error value error2 to zero. The output signal Comp_out of the comparator 222 is a logical 1 when the error value error2 is lesser than zero and is otherwise a logical 0. In an example, the output signal Comp_out is sent to the AND gate 224. In an example, the AND gate 224 receives a second input as an IDLE signal from node 239 of the pulse generator 226. The IDLE signal is a logical 1 when PMOS switch 242 and NMOS switch 244 are switched OFF and is otherwise a logical 0. For instance, during a current DCM switching cycle when the inductor current $I_L$ is high, the output voltage Vout drops to a lower value but is above zero. As the DCM switching cycle is ongoing, the pulse generator 226 sends a logical 0 as the IDLE signal to the AND gate 224 that indicates either of the PMOS switch 242 or the NMOS switch 244 are switched ON. A logical 0 IDLE signal represents an ongoing DCM switching cycle, and a new DCM switching cycle cannot be started until a logical 1 IDLE signal is received. The output of the AND gate 224 is a logical 1 when the IDLE signal is a logical 1 and the output signal Comp_out is a logical 1. A logical 1 output signal from the AND gate 224 triggers the pulse generator 226 to start a new DCM switching cycle. Otherwise, output of the AND gate 224 is a logical 0. In an example, the AND gate 224 sends a trigger signal to the pulse generator 226 to start a new DCM switching cycle that instructs the pulse generator 226 to provide control signals to the gates of the PMOS switch 242 and the NMOS switch 244.

In the DCM measurement control loop, after the DCM switching cycle is initiated, the ripple voltage control circuit 200 is configured to determine the ripple voltage when the first control loop triggers a new DCM switching cycle and adjusts the peak inductor current k peak such that the ripple voltage converges to a desired target ripple voltage. In an example, the ripple voltage control circuit 200 determines the ripple voltage of the output voltage Vout at node N2. In an example, the ADC 206 periodically obtains the output voltage Vout at node N2 using sensors. For each measured amplitude of the output voltage Vout, the ADC 206 converts the measured amplitude of the output voltage Vout to a digital code ADC_code. The ADC 206 provides the digital value ADC_code representing the output voltage Vout to the ripple detector 208.

The ripple detector 208 receives the Vout digital value ADC_code from the ADC 206. The ripple detector 208 converts the digital value ADC_code to a digital code code1 using predetermined or precalculated voltage values of the target output voltage Vout_target. Digital code code1 is a digital code that corresponds to a discrete value of the ripple voltage.

The adder 210 receives the digital code code1 from the ripple detector 208 and compares it to a ripple target code 234. The ripple target code 234 corresponds to a digital code of a target ripple voltage in millivolt (mV). In examples, the ripple target code 234 is stored in the pulse generator 226 or storage 114 and is retrieved by the pulse generator 226. In an example, the ripple target code 234 for a 10 millivolt (mV) ripple voltage is a first ripple target code 234, and the ripple target code 234 for a 5 mV ripple voltage is a second ripple target code 234.

The adder 210 subtracts the ripple digital code code1 from the ripple target code 234 and outputs a digital error code error1 representing a difference between the ripple digital code code1 and the voltage target code 232.

The ripple coefficient comparator 212 receives the error code error1 from the adder 210. In an example, the ripple coefficient comparator 212 includes predetermined or pre-calculated ripple coefficients $K_{RIP}$ for different values of ripple voltage. Each ripple coefficient $K_{RIP}$ represents a gain of the first digital control loop. Using the error code error1, the ripple coefficient comparator 212 obtains a digital code code2 corresponding to a predetermined or precalculated new ripple coefficient $K_{RIP1}$ and sends the digital code code2 to the accumulator 214.

For each DCM switching cycle, the accumulator 214 stores the ripple coefficients $K_{RIP}$ that are received from the ripple coefficient comparator 212. Based on a proportional error between the ripple coefficient $K_{RIP1}$ and stored ripple coefficients $K_{RIP}$, the accumulator 214 increments or decrements the peak inductor current $I_{L\_peak}$ for the current DCM switching cycle. The accumulator 214 obtains a digital code code3 from the proportional error. The digital code code3 represents a digital value for a reference inductor current $I_{L\_REF}$. In an example, the reference inductor current $I_{L\_REF}$ is an analog representation of a digital value of a desired maximum inductor current for a subsequent DCM switching cycle. Adjusting the reference inductor current $I_{L\_REF}$ based on the ripple in Vout observed over one or more cycles provides accurate closed loop regulation of the voltage ripple in the output.

The DAC 216 converts the digital code code3 representing the reference inductor current $I_{L\_REF}$ to an analog signal representing the reference inductor current $I_{L\_REF}$ and sends it to the peak current detector 218. In an example, the peak current detector 218 is a comparator that compares the reference inductor current $I_{L\_REF}$ with a peak inductor current $I_{L\_peak}$ that is measured at node N1. Measuring a peak inductor current $I_{L\_peak}$ triggers the peak current detector 218 to obtain the difference of the reference inductor current $I_{L\_REF}$ with the peak inductor current $I_{L\_peak}$. An output signal $I_{L\_DIFF}$ of the peak current detector 218 takes the value of logical 1 when the reference inductor current $I_{L\_REF}$ is lesser than the inductor current $I_L$ and is otherwise a logical 0. The output signal $I_{L\_DIFF}$ is sent to the pulse generator 226. In an example, the pulse generator 226 adjusts the DCM switching cycle of a voltage pulse $HS_{PULSE}$ at high-side pulse output 237 and the voltage pulse $LS_{PULSE}$ at low-side pulse output 237based on the output signal $I_{L\_DIFF}$. For instance, for a logical 1, the pulse generator 226 decreases the switching frequency of voltage pulse $HS_{PULSE}$ and voltage pulse $LS_{PULSE}$ and, for a logical 0, the pulse generator 226 increases the frequency of voltage pulse $HS_{PULSE}$ and voltage pulse $LS_{PULSE}$. In an example, the ripple voltage control circuit 200 disclosed herein controls the ripple voltage of an output voltage Vout of a DC-DC switched converter 240 operating in a DCM that is independent of the direct current (DC) input voltage (e.g., battery voltage), inductor and capacitor components used, and the low and medium load currents drawn by an electronic device.

Figure 3:
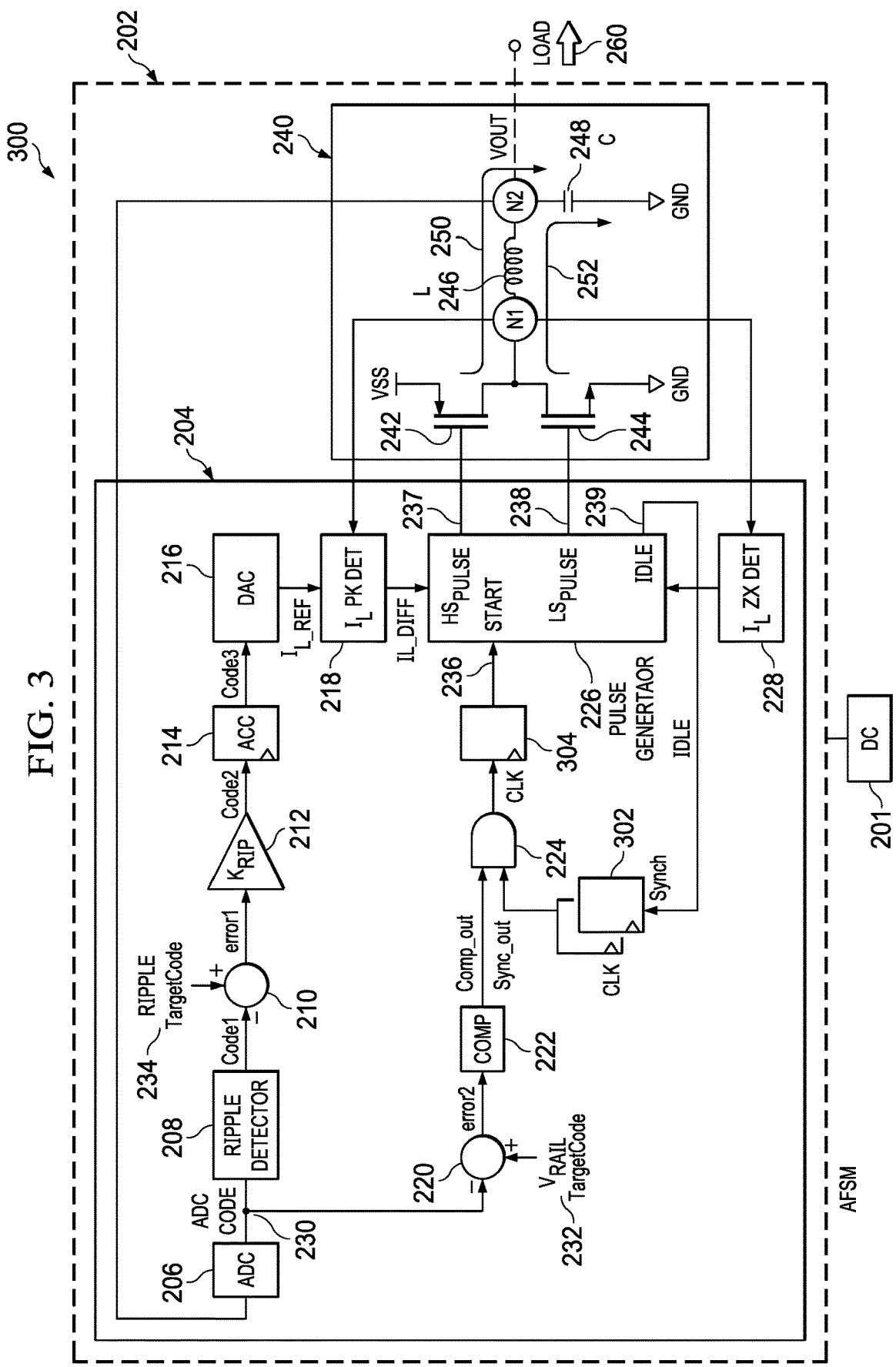
FIG. 3 is a schematic block diagram of a ripple voltage control circuit in accordance with various examples.

FIG. 3 is a schematic block diagram of ripple voltage control circuit 300 in accordance with another example. Ripple voltage control circuit 300 is an alternative example of ripple voltage control circuit 200 of FIG. 2 and includes substantially the same components of the ripple voltage control circuit 200, but further includes a synchronizer flip-flop 302 and flip-flop 304 in the ripple voltage detector circuit 204 in order to synchronize the output signal Comp_out with asynchronous IDLE signal from the pulse generator 226. In an example, the synchronizer flip-flop 302 includes two D flip-flops. A first input of the AND gate 224 is coupled to the comparator 222 and a second input of the AND gate 224 is coupled to the synchronizer flip-flop 302. The synchronizer flip-flop 302 receives the IDLE signal from the pulse generator 226 and outputs a logical 1 signal when receiving a clock signal CLK. A first input of the synchronizer flip-flop 302 is the IDLE signal from the pulse generator 226 and a second input is a clock signal CLK. The synchronizer flip-flop 302 synchronizes the IDLE signal to the clock signal CLK. The output of the synchronizer flip-flop 302 is inputted to the AND gate 224. The output of the AND gate 224 is coupled to a flip-flop 304. The output of the flip-flop 304 is coupled to the pulse generator 226 at node 236.

In operation, the synchronizer flip-flop 302 samples the IDLE signal with a clock signal CLK at each DCM switching cycle. The synchronizer flip-flop 302 produces a synchronized output signal sync_out of logical 1 when the IDLE signal is a logical 1 during a rising edge of the clock signal CLK. The synchronizer flip-flop 302 maintains the output state of the synchronizer flip-flop 302 for a logical 0 IDLE signal. For instance, the synchronizer flip-flop 302 changes the output state during a rising edge of the clock signal CLK and when the IDLE signal is a logical 0. The AND gate 224 receives the output signal Comp_out from the comparator 222 and the synchronized output signal sync_out. The output of the AND gate 224 is a logical 1 when both output signal Comp_out and synchronized output signal sync_out are a logical 1, and is otherwise a logical 0 when one or both of output signal Comp_out and synchronized output signal sync_out is a logical 0. The output of the AND gate 224 is inputted into flip-flop 304 to synchronize a DCM switching cycle request to the clock signal CLK. The output of the flip-flop 304 is a logical 1 when the input signal is a logical 1 during a rising edge of the clock signal CLK, and maintains the logical 1 state until a clock signal CLK is received when the output of the AND gate 224 is a logical 0. In an example, the ripple voltage control circuit 300 disclosed herein controls the ripple voltage of an output voltage Vout of a DC-DC switched converter 240 operating in a DCM that is independent of the direct current (DC) input voltage (e.g., battery voltage), inductor and capacitor components used, and the low and medium load currents drawn by an electronic device.

Figure 4:
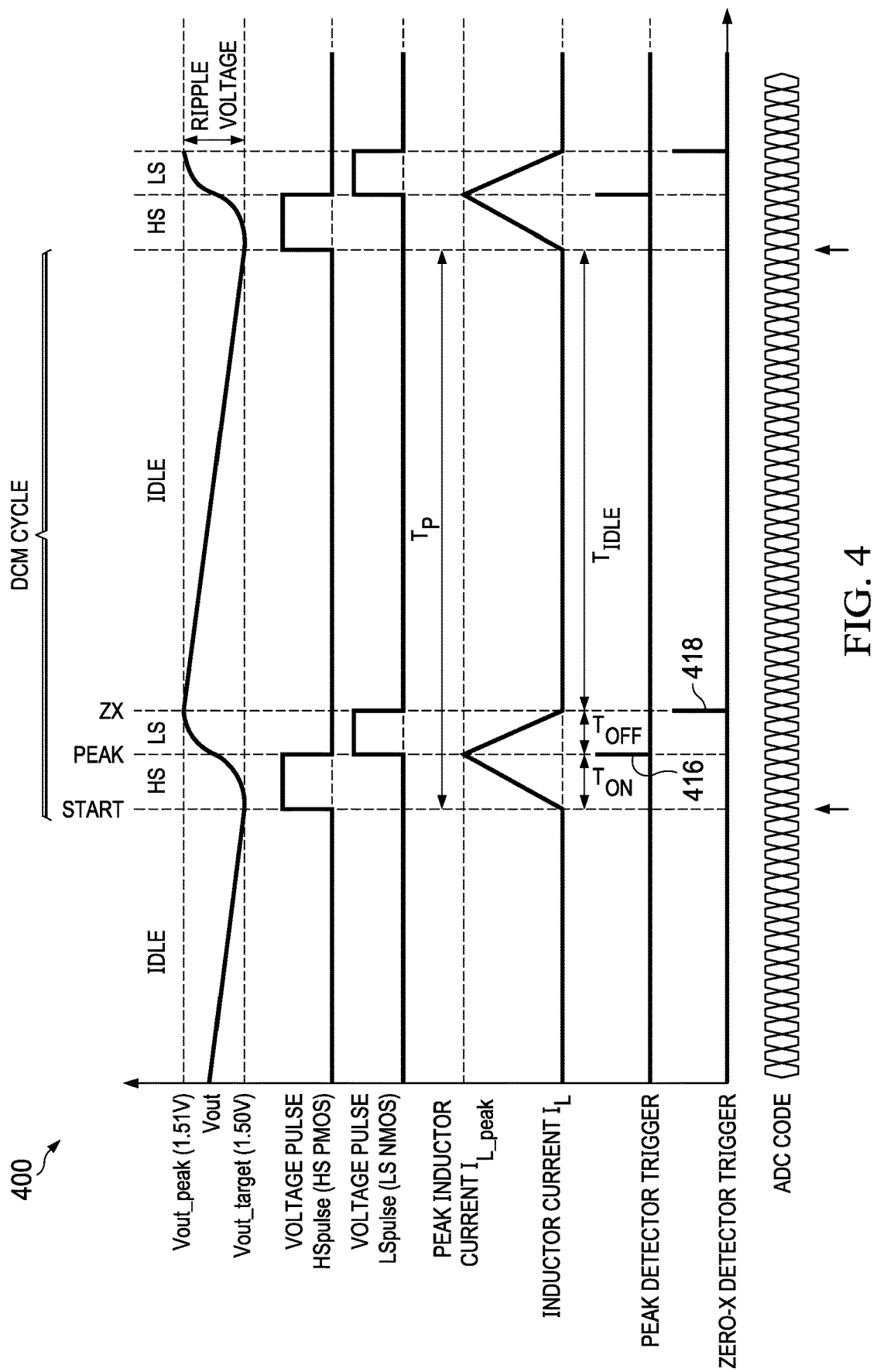
FIG. 4 is a waveform diagram illustrating the operation of a ripple voltage control circuit in accordance with various examples.

FIG. 4 is a waveform diagram 400 illustrating operation of ripple voltage control circuit 200 of FIG. 2 in accordance with various examples. In an example, Vout is the output voltage measured at node N2 of the DC-DC converter 240, Vout_peak is a peak output voltage of Vout, and Vout_target is based on a minimum desired output voltage for the DC-DC converter 240, with the ripple voltage of the output voltage being the peak-to-trough difference in Vout. Each DCM switching cycle of the DC-DC converter 240 occurs during a DCM time period $T_P$. Each time period $T_P$ includes an on-time time period ToN, an off-time time period Torr, and a time idle time period $T_{IDLE}$.

When the output voltage Vout reaches a Vout_target, the ADC 206 sends a digital code ADC_code to the pulse generator 226 to start a DCM switching cycle. During the on-time time period TON, the PMOS switch 242 is turned ON with a high voltage pulse at high-side pulse output 237 at the start of the DCM switching cycle, which causes the inductor current k to increase from a zero point to a peak inductor current $I_{L\_peak}$. Output voltage Vout at the load 260 increases from Vout_target as the inductor 246 is charged. A peak current detector 218 detects that the inductor current $I_L$ has reached a peak inductor current $I_{L\_peak}$ and sends a trigger signal 416 to the pulse generator 226 to turn OFF the PMOS switch 242 and turn ON the NMOS switch 244. The pulse generator 226 disables the high voltage pulse HSpulse to the PMOS switch 242 and enables a voltage pulse LSpulse at low-side pulse output 238 to the NMOS switch 244, which starts the off-time time period $T_{OFF}$. During the off-time time period $T_{OFF}$, the inductor current $I_L$ decreases from peak inductor current $I_{L\_peak}$ to the zero point (ZX), and the output voltage Vout at the load 260 increases towards Vout_peak as the inductor 246 is discharged. As the inductor current $I_L$ decreases, a zero-crossing current detector 228 detects when the inductor current $I_L$ reaches a zero value (ZX). The zero-crossing current detector 228 sends a trigger signal 418 to the pulse generator 226 to turn OFF the NMOS switch 244. The pulse generator 226 disables the voltage pulse LSpulse at low-side pulse output 238 to the NMOS switch 244. During the time idle time period $T_{IDLE}$, the inductor current $I_L$ is at the zero point as the PMOS switch 242 and the NMOS switch 244 are both OFF. For each DCM switching cycle, a ripple voltage detector circuit 204 stores ripple coefficients $K_{RIP}$ that are proportional to a discrete value of a ripple voltage. In an example, the ripple voltage detector circuit 204 increments or decrements the peak inductor current $I_{L\_peak}$ using the proportional error between a ripple coefficient $K_{RIP1}$ for the current DCM switching cycle and stored ripple coefficients $K_{RIP}$ to obtain an error code representing a reference peak inductor current $I_{L\_peak}$ for a subsequent DCM switching cycle. When the output voltage Vout reaches a Vout_target, the ADC 206 sends a digital code ADC_code to the pulse generator 226 to start another DCM switching cycle with the new peak inductor current k peak. In an example, the ripple voltage control circuit disclosed herein (for example, ripple voltage control circuits 200 or 300) controls the ripple voltage between Vout_peak and Vout_target of an output voltage Vout of a DC-DC switched converter (for example, DC-DC switched converter 240) operating in a DCM that is independent of the direct current (DC) input voltage (e.g., battery voltage), inductor and capacitor components used, and the low and medium load currents drawn by an electronic device.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A system comprising:
   a voltage converter circuit comprising:
      an inductor comprising a first inductor end and a second inductor end;
      a first switch coupled between a voltage source and the first inductor end and comprising a first gate terminal; and
      a second switch coupled between the first inductor end and ground and comprising a second gate terminal; and
   a ripple voltage detector circuit, comprising:
      a pulse generator coupled to the first gate terminal of the first switch and the second gate terminal of the second switch;
      and
      a first control loop coupled to the pulse generator and configured to:
         determine an output ripple voltage in an output voltage of the voltage converter circuit based on a measurement of the output voltage;
         determine a ripple coefficient based on the output ripple voltage;
         determine a reference inductor current based on the ripple coefficient; and
         control a peak value of the inductor current based on the reference inductor current during a discontinuous conduction mode (DCM).

2. The system of claim 1, wherein the first control loop is configured to:
   obtain the measurement of the output voltage during a first DCM switching cycle;
   determine the output ripple voltage based on the output voltage; and
   control the peak value of the inductor current based on the reference inductor current for a second DCM switching cycle.

3. The system of claim 1, wherein the first control loop further comprises an analog-to-digital converter (ADC) coupled to the voltage converter circuit, and wherein the ADC is configured to:
   receive a measurement of the output voltage; and
   convert the measurement of the output voltage to a digital value.

4. The system of claim 3, wherein the first control loop further comprises a ripple detector coupled to the ADC, and wherein the ripple detector is configured to:
   receive, from the ADC, the digital value of the output voltage;
   isolate an AC component of the digital value from a DC component of the digital value; and
   determine, based on the AC component, a value representing the output ripple voltage of the output voltage.

5. The system of claim 4,
wherein the first control loop further comprises a ripple coefficient comparator and an integrator coupled to the ripple coefficient comparator,
wherein the ripple coefficient comparator is configured to:
  obtain an error representing a difference between the value representing the output ripple voltage and a ripple target value; and
  determine the ripple coefficient based on the error, and
wherein the integrator is configured to:
  determine an adjustment value based on the ripple coefficient; and
  determine the reference inductor current based on the adjustment value.

6. The system of claim 5, wherein the first control loop further comprises a digital-to-analog converter (DAC) coupled to the integrator, and wherein the DAC is configured to:
  receive, from the integrator, a digital value representing the reference inductor current; and
  convert the third digital value to an analog value.

7. The system of claim 6, wherein the first control loop further comprises a peak current detector coupled to the DAC, and wherein the peak current detector is configured to:
  determine the peak value of the inductor current based on a measurement of the inductor current; and
  determine, based on a difference between the analog value from the DAC and the peak value of the inductor current, an output to the pulse generator.

8. The system of claim 1, wherein the ripple voltage detector circuit further comprises a zero-crossing current detector coupled to the first inductor end, and wherein the zero-crossing current detector is configured to detect that the inductor current reaches a zero value.

9. The system of claim 1, further comprising:
a second control loop comprising:
  an analog-to-digital converter (ADC) coupled to the voltage converter circuit and configured to:
    obtain a measurement of the output voltage from the second inductor end; and
    determine a value representing the output voltage based on the measurement;
  an adder coupled to the ADC and configured to:
    receive, from the ADC, the value representing the output voltage;
    receive a voltage target value representing a target output voltage;
    determine an error value based on a difference between the value representing the output voltage and the voltage target value;
  a comparator coupled to the adder and configured to:
    compare the error value to a zero value; and
    output a comparison result based on the comparison of the error value to the zero value; and
  an AND gate coupled to the comparator and the pulse generator and configured to:
    receive the comparison result from the comparator;
    receive a second signal from the pulse generator; and
    provide a trigger signal to the pulse generator to selectively initiate a DCM switching cycle based on the comparison result and the second signal.

10. The system of claim 9, wherein the pulse generator is configured to generate the second signal to indicate whether to suspend initiation of the DCM switching cycle.

11. A ripple voltage detector circuit, comprising:
a pulse generator configured to generate a signal to control a direct current-to-direct current (DC-DC) converter; and
a control loop coupled to the pulse generator, wherein the control loop is configured to:
  obtain a measurement of an output voltage of the DC-DC converter;
  determine an output ripple voltage of the output voltage based on the measurement;
  determine a ripple coefficient based on the output ripple voltage;
  determine a reference inductor current based on the ripple coefficient;
  determine a peak value of an inductor current of the DC-DC converter during a switching cycle; and
  transition a switching state of the DC-DC converter based on the reference inductor current and the peak value of the inductor current.

12. The ripple voltage detector circuit of claim 11, wherein the control loop further comprises an analog-to-digital converter (ADC) wherein the ADC is configured to:
  obtain the measurement of the output voltage; and
  determine a digital value representing the output voltage based on the measurement.

13. The ripple voltage detector circuit of claim 12, wherein the control loop further comprises a ripple detector, wherein the ripple detector is configured to:
  receive, from the ADC, the digital value of the output voltage; and
  determine, from the digital value of the output voltage, a value representing the output ripple voltage.

14. The ripple voltage detector circuit of claim 13,
wherein the control loop further comprises a ripple coefficient comparator and an integrator,
wherein the ripple coefficient comparator is configured to:
  receive, from the adder, a first obtain an error representing a difference between the value representing the output ripple voltage and a ripple target code; and
  determine the ripple coefficient based on the error, and
wherein the integrator is configured to:
  determine an adjustment value based on the ripple coefficient; and
  determine the reference inductor current based on the adjustment value.

15. The ripple voltage detector circuit of claim 14, wherein the first control loop further comprises a digital-to-analog converter (DAC) coupled to the integrator, wherein the DAC is configured to:
  receive, from the integrator, a digital code representing the reference inductor current; and
  convert the digital code to an analog value.

16. The ripple voltage detector circuit of claim 15, wherein the control loop comprises a peak current detector coupled to the DAC, and wherein the peak current detector is configured to:
  determine the peak value of the inductor current based on a measurement of the inductor current; and
  determine, based on a difference between the analog value from the DAC and the peak value of the inductor current, an output to the pulse generator.

17. The ripple voltage detector circuit of claim 11, further comprising a zero-crossing current detector, and wherein the zero-crossing current detector is configured to determine that the inductor current reaches a zero value.

18. The ripple voltage detector circuit of claim 11, wherein the first further comprising:
- an ADC and configured to:
  - obtain the measurement of the output voltage; and
  - determine a value representing the output voltage based on the measurement;
- an adder coupled to the ADC and configured to:
  - receive, from the ADC, the value representing the output voltage;
  - receive a voltage target value representing a target output voltage;
  - obtain an error value based on a difference between the value representing the output voltage and the voltage target value; and
- a comparator coupled to the adder and configured to compare the error value to a zero value.

19. A system, comprising:
- a voltage converter circuit, comprising:
  - a first switch coupled to a pulse generator, wherein the first switch is configured to receive signals from the pulse generator that cause the first switch to selectively turn ON and turn OFF during a switching cycle;
  - a second switch coupled to the pulse generator, wherein the second switch is configured to receive signals from the pulse generator that cause the second switch to selectively turn ON and turn OFF during the switching cycle;
  - an inductor comprising a first inductor end and a second inductor end, wherein the first inductor end is coupled to the first switch and to the second switch; and
  - a capacitor comprising a first capacitor end and a second capacitor end, wherein the first capacitor end is coupled to the second inductor end; and
- a ripple voltage detector circuit coupled to the voltage converter circuit and comprising:
  - the pulse generator; and
  - a first control loop coupled to the pulse generator and the voltage converter circuit, wherein the first control loop is configured to:
    - measure an output voltage of the voltage converter circuit;
    - determine an output ripple voltage of the output voltage;
    - determine a ripple coefficient based on the output ripple voltage;
    - determine a reference peak inductor current based on the ripple coefficient;
    - determine a peak value of an inductor current during the switching cycle; and
    - transition a switching state of the voltage converter circuit based on the reference peak inductor current and the peak value of the inductor current.

20. The system of claim 19, wherein the ripple voltage detector circuit comprises a peak current detector coupled to the inductor and the pulse generator, and wherein the peak current detector is configured to:
- obtain the peak value of the inductor current; and
- determine, based on a difference between the peak value of the inductor current and a value representing the reference peak inductor current, an output to the pulse generator.

* * * * *